(12) United States Patent
Wang

(10) Patent No.: US 12,087,355 B2
(45) Date of Patent: Sep. 10, 2024

(54) ADAPTIVE CONTROL CIRCUIT OF STATIC RANDOM ACCESS MEMORY

(71) Applicant: MEDIATEK INC., Hsinchu (TW)

(72) Inventor: Dao-Ping Wang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 99 days.

(21) Appl. No.: 17/936,559

(22) Filed: Sep. 29, 2022

(65) Prior Publication Data

US 2023/0197144 A1  Jun. 22, 2023

Related U.S. Application Data

(60) Provisional application No. 63/290,742, filed on Dec. 17, 2021.

(51) Int. Cl.
  *G11C 11/00* (2006.01)
  *G11C 11/412* (2006.01)
  *G11C 11/419* (2006.01)

(52) U.S. Cl.
  CPC .......... *G11C 11/412* (2013.01); *G11C 11/419* (2013.01)

(58) Field of Classification Search
  CPC ............................ G11C 11/412; G11C 11/419
  USPC ...................................................... 365/154
  See application file for complete search history.

(56) References Cited

U.S. PATENT DOCUMENTS

| 4,437,135 | A | 3/1984 | Ogata | |
| 6,590,800 | B2* | 7/2003 | Chang | G11C 11/412 |
| | | | | 365/175 |
| 7,457,182 | B2 | 11/2008 | Maki et al. | |
| 9,257,178 | B1* | 2/2016 | Chou | G11C 11/4074 |
| 9,437,752 | B2* | 9/2016 | Berger | H01L 29/66151 |
| 9,997,236 | B1* | 6/2018 | Pathak | G11C 11/419 |
| 10,878,891 | B1* | 12/2020 | Goel | G11C 11/412 |
| 11,152,902 | B2 | 10/2021 | Yasuda | |
| 11,881,859 | B2* | 1/2024 | Gupta | H03K 19/20 |
| 2008/0122525 | A1* | 5/2008 | Lee | G11C 11/417 |
| | | | | 327/535 |
| 2012/0327727 | A1* | 12/2012 | Wang | G11C 11/417 |
| | | | | 365/189.16 |

(Continued)

FOREIGN PATENT DOCUMENTS

| EP | 1 089 286 B1 | 1/2005 |
| TW | 201931952 A | 8/2019 |
| TW | I702609 B | 8/2020 |

OTHER PUBLICATIONS

Extended European Search Report dated 2023-05-03, issued in application No. EP 22210449.9.

(Continued)

*Primary Examiner* — Viet Q Nguyen
(74) *Attorney, Agent, or Firm* — McClure, Qualey & Rodack, LLP

(57) ABSTRACT

An adaptive control circuit of SRAM (Static Random Access Memory) includes a switch circuit, a forward diode-connected transistor, a backward diode-connected transistor, and a first delay circuit. The switch circuit is supplied by a supply voltage, and is coupled to a first node. The backward diode-connected transistor is coupled in parallel with the forward diode-connected transistor between the first node and a second node. The first delay circuit is coupled between the second node and a ground voltage.

20 Claims, 5 Drawing Sheets

(56) References Cited

U.S. PATENT DOCUMENTS

| | | | | |
|---|---|---|---|---|
| 2014/0293723 | A1* | 10/2014 | Grover | G11C 7/06 |
| | | | | 365/210.1 |
| 2017/0117419 | A1* | 4/2017 | Berger | H01L 29/165 |
| 2019/0208590 | A1 | 7/2019 | Lau | |
| 2021/0218398 | A1* | 7/2021 | Hung | H01L 21/283 |
| 2022/0358997 | A1* | 11/2022 | She | G11C 11/4076 |
| 2023/0260570 | A1* | 8/2023 | Lin | G11C 11/418 |
| | | | | 365/154 |

OTHER PUBLICATIONS

Enomoto, T., et al.; "A Large "Read" and "Write" Margins, Low Leakage Power, Six-Transistor 90-nm CMOS SRAM;" IEICE Trans. Electron.; vol. E94-C; No. 4; Apr. 2011; pp. 530-538.

Chinese language office action dated Apr. 17, 2024, issued in application No. TW 111141064.

* cited by examiner

ADAPTIVE CONTROL CIRCUIT OF STATIC RANDOM ACCESS MEMORY

CROSS REFERENCE TO RELATED APPLICATIONS

This application claims the benefit of U.S. Provisional Application No. 63/290,742, filed on Dec. 17, 2021, the entirety of which is incorporated by reference herein.

BACKGROUND OF THE INVENTION

Field of the Invention

The disclosure generally relates to a control circuit, and more specifically, to an adaptive control circuit of SRAM (Static Random Access Memory).

Description of the Related Art

In a conventional design, if the control circuit of a SRAM (Static Random Access Memory) is supplied by a variable supply voltage, the corresponding read margin of the control circuit may be insufficient. Furthermore, the control circuit may suffer from a slow operational speed. Accordingly, there is a need to propose a novel solution for solving the problems of the prior art.

BRIEF SUMMARY OF THE INVENTION

In an exemplary embodiment, the disclosure is directed to an adaptive control circuit of SRAM (Static Random Access Memory). The adaptive control circuit includes a switch circuit, a forward diode-connected transistor, a backward diode-connected transistor, and a first delay circuit. The switch circuit is supplied by a supply voltage, and is coupled to a first node. The backward diode-connected transistor is coupled in parallel with the forward diode-connected transistor between the first node and a second node. The first delay circuit is coupled between the second node and a ground voltage.

In some embodiments, if the supply voltage is higher than or equal to a threshold voltage, the forward diode-connected transistor will be enabled.

In some embodiments, the switch circuit includes a first transistor. The first transistor has a control terminal for receiving a clock voltage, a first terminal coupled to the supply voltage, and a second terminal coupled to the first node.

In some embodiments, the first transistor is implemented with a PMOSFET (P-type Metal-Oxide-Semiconductor Field-Effect Transistor).

In some embodiments, the forward diode-connected transistor is a second transistor which has a control terminal coupled to the first node, a first terminal coupled to the second node, and a second terminal coupled to the first node.

In some embodiments, the second transistor is implemented with an NMOSFET (N-type Metal-Oxide-Semiconductor Field-Effect Transistor).

In some embodiments, the backward diode-connected transistor is a third transistor which has a control terminal coupled to the second node, a first terminal coupled to the first node, and a second terminal coupled to the second node.

In some embodiments, the third transistor is implemented with an NMOSFET.

In some embodiments, the first delay circuit is a capacitive element or a resistive element.

In some embodiments, the first delay circuit includes a fourth transistor. The fourth transistor has a control terminal coupled to the second node, a first terminal coupled to the ground voltage, and a second terminal coupled to the ground voltage.

In some embodiments, the fourth transistor is implemented with an NMOSFET.

In some embodiments, the switch circuit further includes a fifth transistor. The fifth transistor has a control terminal for receiving the clock voltage, a first terminal coupled to the ground voltage, and a second terminal coupled to the first node.

In some embodiments, the fifth transistor is implemented with an NMOSFET.

In some embodiments, the adaptive control circuit further includes a second delay circuit coupled to the first node.

In some embodiments, the second delay circuit includes a sixth transistor. The sixth transistor has a control terminal coupled to the ground voltage, a first terminal coupled to the first node, and a second terminal coupled to the ground voltage.

In some embodiments, the sixth transistor is implemented with an NMOSFET.

In some embodiments, the adaptive control circuit further includes a third delay circuit coupled to the first node.

In some embodiments, the third delay circuit includes a seventh transistor. The seventh transistor has a control terminal coupled to the first node, a first terminal coupled to the ground voltage, and a second terminal coupled to the ground voltage.

In some embodiments, the seventh transistor is implemented with an NMOSFET.

In some embodiments, the adaptive control circuit further includes an inverter. The inverter has an input terminal coupled to the first node, and a second terminal coupled to an output node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
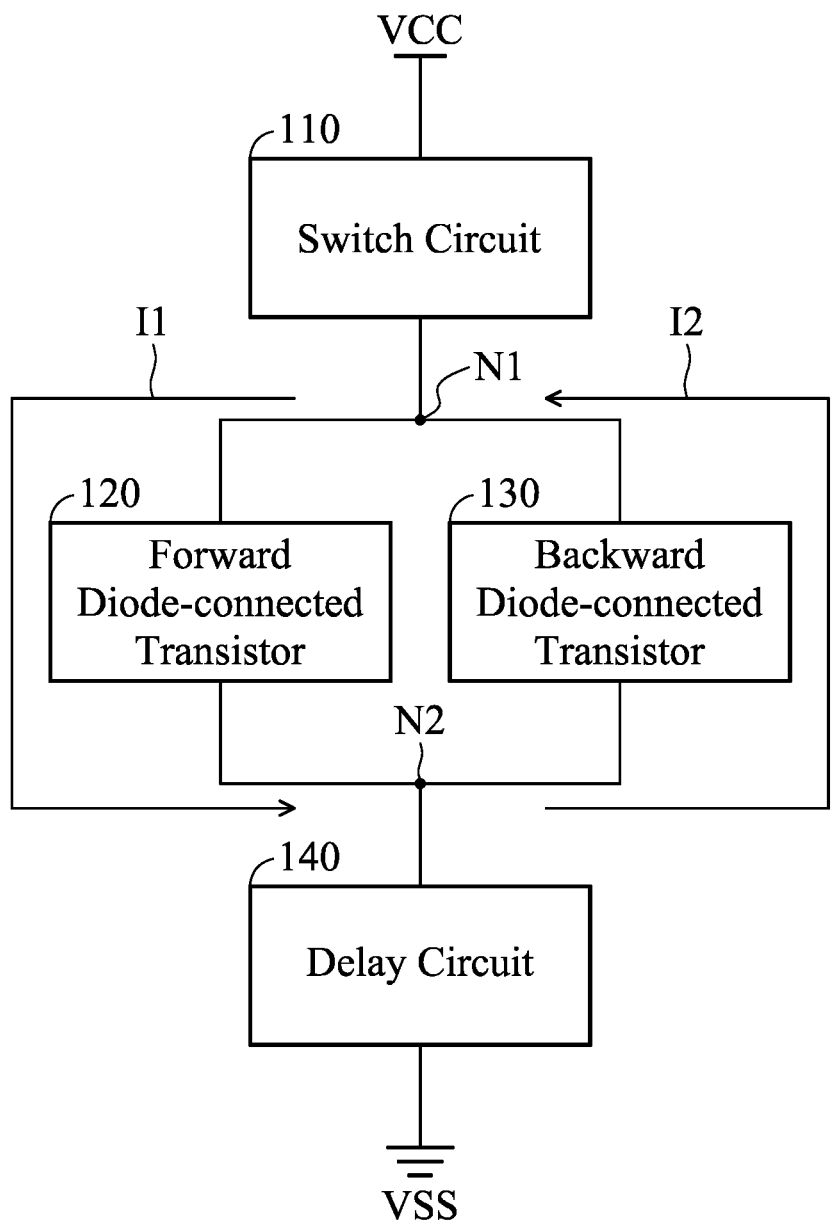
FIG. 1 is a diagram of an adaptive control circuit of SRAM (Static Random Access Memory) according to an embodiment of the invention.

FIG. 1 is a diagram of an adaptive control circuit 100 of SRAM (Static Random Access Memory) according to an embodiment of the invention. As shown in FIG. 1, the adaptive control circuit 100 includes a switch circuit 110, a forward diode-connected transistor 120, a backward diode-connected transistor 130, and a first delay circuit 140. The switch circuit 110 is supplied by a supply voltage VCC, and is coupled to a first node N1. The supply voltage VCC is variable. For example, the supply voltage VCC may have any voltage level which is higher than or equal to 0.4V, but it is not limited thereto. The backward diode-connected transistor 130 is coupled in parallel with the forward diode-connected transistor 120 between the first node N1 and a second node N2. The first delay circuit 140 is coupled between the second node N2 and the ground voltage VSS. For example, the ground voltage VSS may have a voltage level of 0V. The first delay circuit 140 may be a capacitive element or a resistive element, but it is not limited thereto.

In some embodiments, if the supply voltage VCC is lower than a threshold voltage, both the forward diode-connected transistor 120 and the backward diode-connected transistor 130 will be disabled. In alternative embodiments, if the supply voltage VCC is higher than or equal to the threshold voltage, the forward diode-connected transistor 120 will be enabled (the backward diode-connected transistor 130 may also be enabled). For example, the aforementioned threshold voltage may be equal to 0.6V, but it is not limited thereto. The enabled forward diode-connected transistor 120 can conduct a first current I1 from the first node N1 to the second node N2. On the other hand, if the backward diode-connected transistor 130 is enabled, it will conduct a second current I2 from the second node N2 to the first node N1, so as to make the first delay circuit 140 return to its initial state.

According to practical measurements, this design for the adaptive control circuit 100 not only provides an acceptable operational speed but also maintains a sufficient read margin. For example, the operational speed of the adaptive control circuit 100 may be at least 100 MHz, and the read margin of the adaptive control circuit 100 may be at least 100 mV, but they are not limited thereto. Therefore, the proposed adaptive control circuit 100 will have good operational performance even if it is supplied by the variable supply voltage VCC.

The following embodiments will introduce different configurations and detail structural features of the adaptive control circuit 100. It should be understood that these figures and descriptions are merely exemplary, rather than limitations of the invention.

Figure 2:
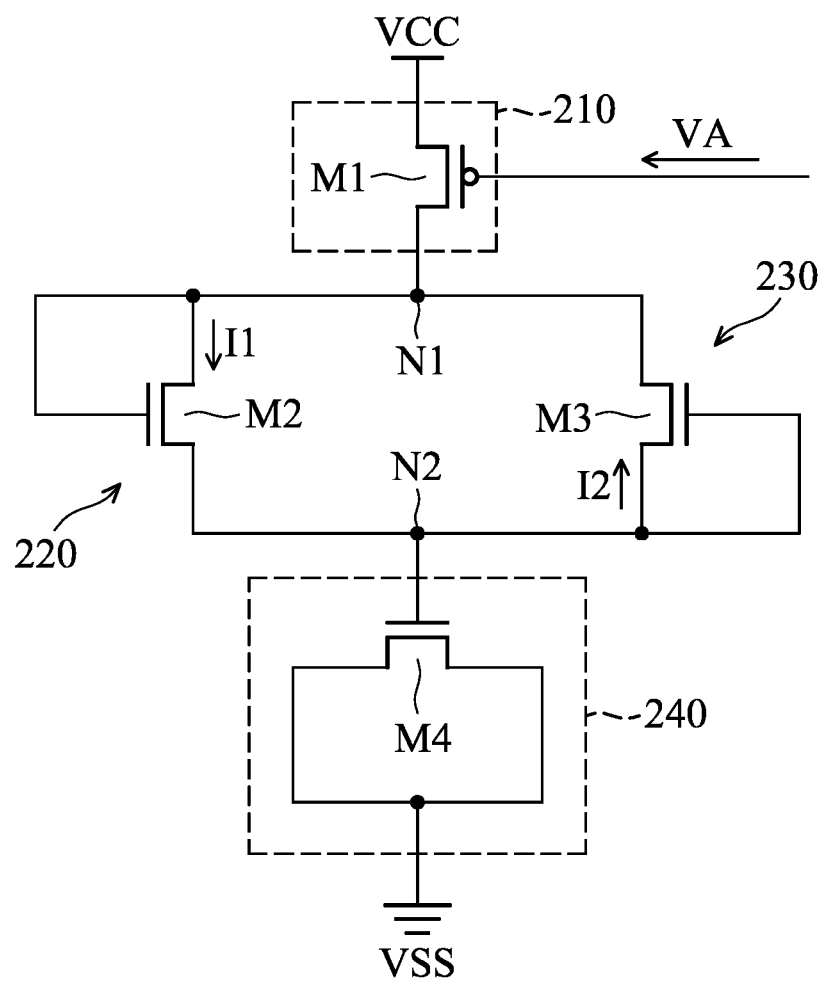
FIG. 2 is a circuit diagram of an adaptive control circuit of SRAM according to an embodiment of the invention.

FIG. 2 is a circuit diagram of an adaptive control circuit 200 of SRAM according to an embodiment of the invention. In the embodiment of FIG. 2, the adaptive control circuit 200 includes a switch circuit 210, a forward diode-connected transistor 220, a backward diode-connected transistor 230, and a first delay circuit 240.

The switch circuit 210 includes a first transistor M1. The first transistor M1 has a control terminal (e.g., a gate) for receiving a clock voltage VA, a first terminal (e.g., a source/drain) coupled to a supply voltage VCC, and a second terminal (e.g., another source/drain) coupled to a first node N1. The forward diode-connected transistor 220 is a second transistor M2 which has a control terminal (e.g., a gate) coupled to the first node N1, a first terminal (e.g., a source/drain) coupled to a second node N2, and a second terminal (e.g., another source/drain) coupled to the first node N1. The backward diode-connected transistor 230 is a third transistor M3 which has a control terminal (e.g., a gate) coupled to the second node N2, a first terminal (e.g., a source/drain) coupled to the first node N1, and a second terminal (e.g., another source/drain) coupled to the second node N2. The first delay circuit 240 includes a fourth transistor M4. The fourth transistor M4 has a control terminal (e.g., a gate) coupled to the second node N2, a first terminal (e.g., a source/drain) coupled to the ground voltage VSS, and a second terminal (e.g., another source/drain) coupled to the ground voltage VSS. In some embodiments, the first transistor M1 is implemented with a PMOSFET (P-type Metal-Oxide-Semiconductor Field-Effect Transistor), and each of the second transistor M2, the third transistor M3, and the fourth transistor M4 is implemented with an NMOSFET (N-type Metal-Oxide-Semiconductor Field-Effect Transistor).

If the clock voltage VA has a low logic level, the first transistor M1 will be enabled to pre-charge the first node N1. Conversely, if the clock voltage VA has a high logic level, the first transistor M1 will stop pre-charging the first node N1. The second transistor M2 is configured to selectively conduct a first current I1 from the first node N1 to the second node N2. The third transistor M3 is configured to selectively conduct a second current I2 from the second node N2 to the first node N1. The fourth transistor M4 is used as a small-size chip capacitor. Other features of the adaptive control circuit 200 of FIG. 2 are similar to those of the adaptive control circuit 100 of FIG. 1. Therefore, the two embodiments can achieve similar levels of performance.

Figure 3:
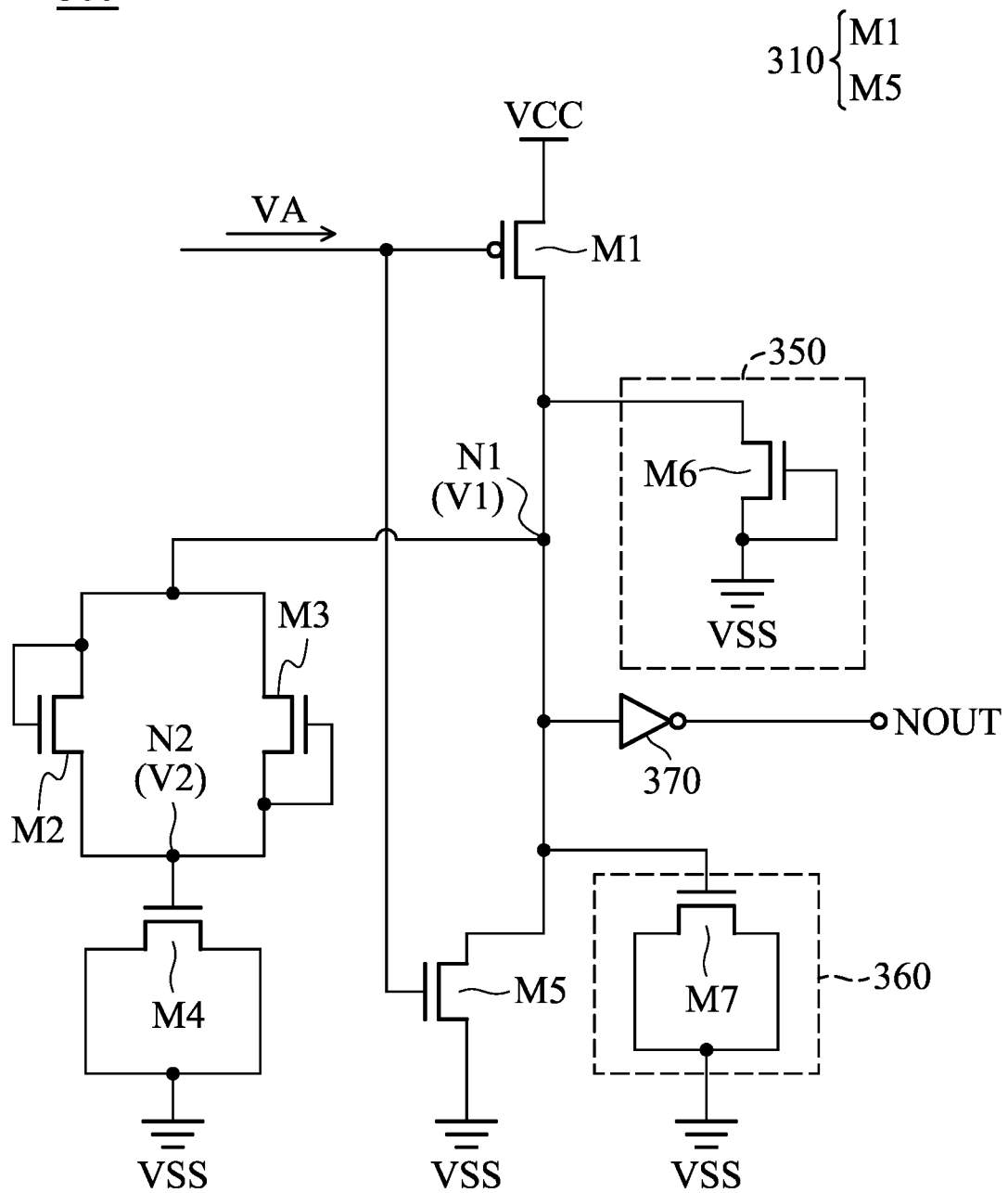
FIG. 3 is a circuit diagram of an adaptive control circuit of SRAM according to an embodiment of the invention.

FIG. 3 is a circuit diagram of an adaptive control circuit 300 of SRAM according to an embodiment of the invention. FIG. 3 is similar to FIG. 2. In the embodiment of FIG. 3, a switch circuit 310 of the adaptive control circuit 300 further includes a fifth transistor M5, and the adaptive control circuit 300 further includes a second delay circuit 350, a third delay circuit 360, and an inverter 370. The second delay circuit 350, the third delay circuit 360, and the inverter 370 are all coupled to the first node N1.

The fifth transistor M5 has a control terminal (e.g., a gate) for receiving the clock voltage VA, a first terminal (e.g., a source/drain) coupled to the ground voltage VSS, and a second terminal (e.g., another source/drain) coupled to the first node N1. The second delay circuit 350 includes a sixth transistor M6. The sixth transistor M6 has a control terminal (e.g., a gate) coupled to the ground voltage VSS, a first terminal (e.g., a source/drain) coupled to the first node N1, and a second terminal (e.g., another source/drain) coupled to the ground voltage VSS. The third delay circuit 360 includes a seventh transistor M7. The seventh transistor M7 has a control terminal (e.g., a gate) coupled to the first node N1, a first terminal (e.g., a source/drain) coupled to the ground voltage VSS, and a second terminal (e.g., another source/drain) coupled to the ground voltage VSS. In some embodiments, each of the fifth transistor M5, the sixth transistor M6, and the seventh transistor M7 is implemented with an NMOSFET. The inverter 370 has an input terminal coupled to the first node N1, and a second terminal coupled to an output node NOUT.

In the embodiment of FIG. 3, the adaptive control circuit 300 is a tracking circuit for controlling a cell array of SRAM (not shown). If the clock voltage VA has a low logic level, the fifth transistor M5 will be disabled. Conversely, if the clock voltage VA has a high logic level, the fifth transistor M5 will be enabled to discharge the first node N1. In alternative embodiments, each of the second delay circuit 350 and the third delay circuit 360 is a capacitive element or a resistive element with a different circuit design. The output node NOUT of the adaptive control circuit 300 is arranged to output the control voltage for controlling the relative circuitry of SRAM (not shown). Other features of the adaptive control circuit 300 of FIG. 3 are similar to those of the adaptive control circuit 200 of FIG. 2. Therefore, the two embodiments can achieve similar levels of performance.

Figure 4:
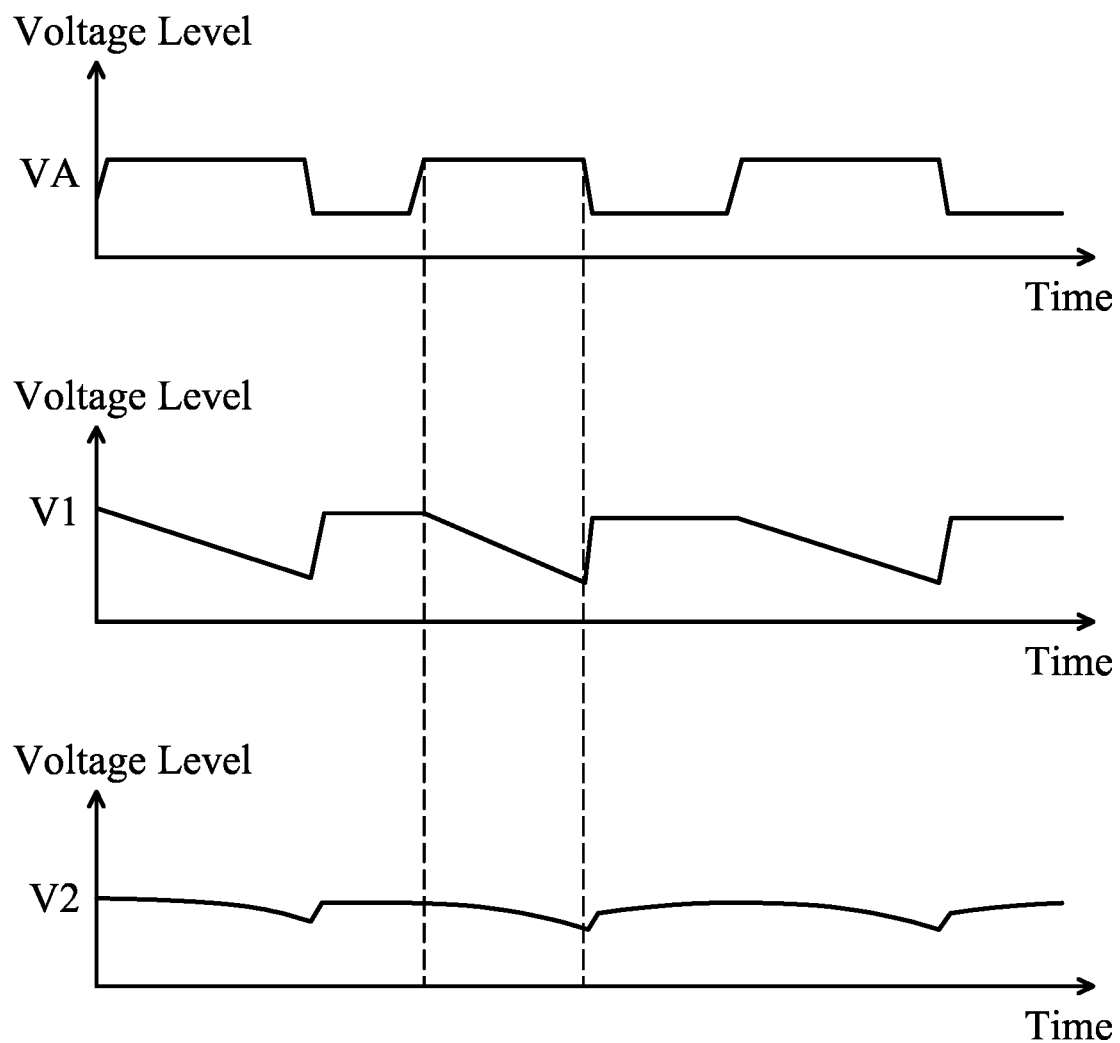
FIG. 4 is a diagram of voltage waveforms of an adaptive control circuit according to an embodiment of the invention.

FIG. 4 is a diagram of voltage waveforms of the adaptive control circuit 300 according to an embodiment of the invention. The horizontal axis represents the time. The vertical axes represent the voltage levels of the clock voltage VA, a first voltage V1 at the first node N1, and a second voltage V2 at the second node N2. According to the measurement of FIG. 4, if the clock voltage VA rises to a high logic level, the first voltage V1 at the first node N1 will become lower, and if the clock voltage VA drops to a low logic level, the first voltage V1 at the first node N1 will become higher. It should be noted that the second voltage V2 at the second node N2 has relatively small variations since it is limited by both the second transistor M2 and the third transistor M3.

Figure 5:
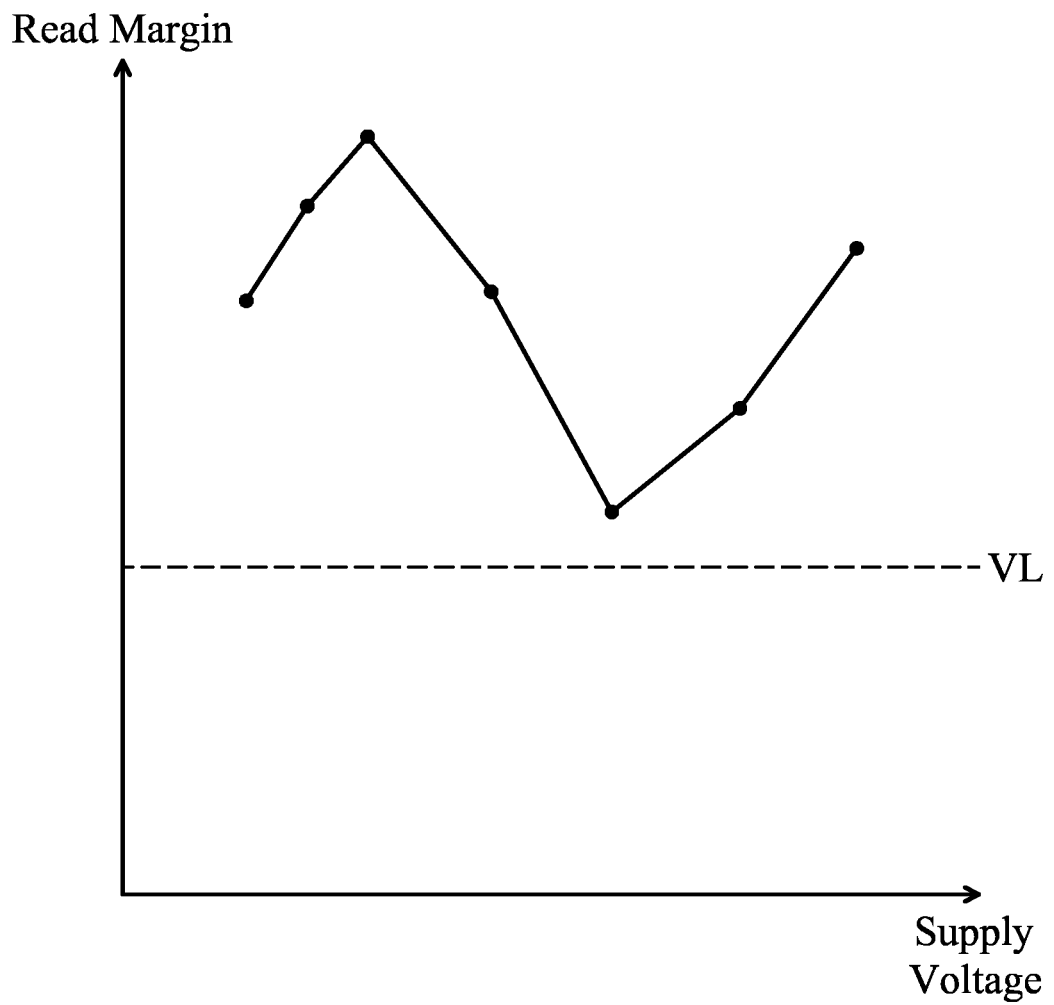
FIG. 5 is a diagram of the relationship between a read margin and a supply voltage of an adaptive control circuit according to an embodiment of the invention.

FIG. 5 is a diagram of the relationship between the read margin and the supply voltage VCC of the adaptive control circuit 300 according to an embodiment of the invention. The horizontal axis represents the voltage level of the supply voltage VCC. The vertical axis represents the voltage level of the read margin. According to the measurement of FIG. 5, the read margin of the adaptive control circuit 300 is always greater than a minimum voltage level VL, regardless of the variations of the supply voltage VCC. For example, the minimum voltage level VL may be equal to 100 mV, but it is not limited thereto. Therefore, the adaptive control circuit 300 can keep a sufficient read margin. It should be understood that the read margin of the adaptive control circuit 300 is also enhanced by the fourth transistor M4 used as a chip capacitor. Furthermore, because of the control circuit 200, the charge and dis-charge current to the capacitance is adaptively limited for a wide-voltage range operation. Hence, the corresponding operational speed can achieve a quite acceptable target (e.g., faster than 100 MHz).

The invention proposes an adaptive control circuit of SRAM. Compared to the conventional design, the invention has at least the advantages of the adaptive supply voltage, the wide-range operation, the sufficient read margin, the low leakage, and the fast operational speed, and therefore it is suitable for application in a variety of electronic devices.

It should be noted that the above voltages, currents, resistances, inductances, capacitances and other element parameters are not limitations of the invention. A designer can adjust these settings according to different requirements. The adaptive control circuit of the invention is not limited to the configurations of FIGS. 1-5. The invention may merely include any one or more features of any one or more embodiments of FIGS. 1-5. In other words, not all of the features displayed in the figures should be implemented in the adaptive control circuit of the invention. Although the embodiments of the invention use MOSFET (Metal-Oxide-Semiconductor Field-Effect Transistor) as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An adaptive control circuit of SRAM (Static Random Access Memory), comprising:
   a switch circuit, supplied by a supply voltage, and coupled to a first node;
   a forward diode-connected transistor;
   a backward diode-connected transistor, coupled in parallel with the forward diode-connected transistor between the first node and a second node; and
   a first delay circuit, coupled between the second node and a ground voltage.

2. The adaptive control circuit as claimed in claim 1, wherein if the supply voltage is higher than or equal to a threshold voltage, the forward diode-connected transistor is enabled.

3. The adaptive control circuit as claimed in claim 1, wherein the switch circuit comprises:
   a first transistor, wherein the first transistor has a control terminal for receiving a clock voltage, a first terminal coupled to the supply voltage, and a second terminal coupled to the first node.

4. The adaptive control circuit as claimed in claim 3, wherein the first transistor is implemented with a PMOSFET (P-type Metal-Oxide-Semiconductor Field-Effect Transistor).

5. The adaptive control circuit as claimed in claim 1, wherein the forward diode-connected transistor is a second transistor which has a control terminal coupled to the first node, a first terminal coupled to the second node, and a second terminal coupled to the first node.

6. The adaptive control circuit as claimed in claim 5, wherein the second transistor is implemented with an NMOSFET (N-type Metal-Oxide-Semiconductor Field-Effect Transistor).

7. The adaptive control circuit as claimed in claim 1, wherein the backward diode-connected transistor is a third transistor which has a control terminal coupled to the second node, a first terminal coupled to the first node, and a second terminal coupled to the second node.

8. The adaptive control circuit as claimed in claim 7, wherein the third transistor is implemented with an NMOSFET.

9. The adaptive control circuit as claimed in claim 1, wherein the first delay circuit is a capacitive element or a resistive element.

10. The adaptive control circuit as claimed in claim 1, wherein the first delay circuit comprises:
   a fourth transistor, wherein the fourth transistor has a control terminal coupled to the second node, a first terminal coupled to the ground voltage, and a second terminal coupled to the ground voltage.

11. The adaptive control circuit as claimed in claim 10, wherein the fourth transistor is implemented with an NMOSFET.

12. The adaptive control circuit as claimed in claim 3, wherein the switch circuit further comprises:
   a fifth transistor, wherein the fifth transistor has a control terminal for receiving the clock voltage, a first terminal coupled to the ground voltage, and a second terminal coupled to the first node.

13. The adaptive control circuit as claimed in claim 12, wherein the fifth transistor is implemented with an NMOSFET.

14. The adaptive control circuit as claimed in claim 1, further comprising:
   a second delay circuit, coupled to the first node.

15. The adaptive control circuit as claimed in claim 14, wherein the second delay circuit comprises:
   a sixth transistor, wherein the sixth transistor has a control terminal coupled to the ground voltage, a first terminal coupled to the first node, and a second terminal coupled to the ground voltage.

16. The adaptive control circuit as claimed in claim 15, wherein the sixth transistor is implemented with an NMOSFET.

17. The adaptive control circuit as claimed in claim 14, further comprising:
   a third delay circuit, coupled to the first node.

18. The adaptive control circuit as claimed in claim 17, wherein the third delay circuit comprises:
   a seventh transistor, wherein the seventh transistor has a control terminal coupled to the first node, a first terminal coupled to the ground voltage, and a second terminal coupled to the ground voltage.

19. The adaptive control circuit as claimed in claim 18, wherein the seventh transistor is implemented with an NMOSFET.

20. The adaptive control circuit as claimed in claim 1, further comprising:
   an inverter, wherein the inverter has an input terminal coupled to the first node, and a second terminal coupled to an output node.

* * * * *